United States Patent
Yu et al.

(10) Patent No.: US 11,387,365 B2
(45) Date of Patent: Jul. 12, 2022

(54) METHOD OF MANUFACTURING A SEMICONDUCTOR DEVICE FOR RECESSED FIN STRUCTURE HAVING ROUNDED CORNERS

(71) Applicant: TAIWAN SEMICONDUCTOR MANUFACTURING CO., LTD., Hsinchu (TW)

(72) Inventors: Cheng-Yen Yu, New Taipei (TW); Po-Chi Wu, Zhubei (TW); Yueh-Chun Lai, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/837,211

(22) Filed: Apr. 1, 2020

(65) Prior Publication Data
US 2021/0313469 A1  Oct. 7, 2021

(51) Int. Cl.
*H01L 29/78* (2006.01)
*H01L 21/285* (2006.01)
(Continued)

(52) U.S. Cl.
CPC .... *H01L 29/7854* (2013.01); *H01L 21/28518* (2013.01); *H01L 21/3065* (2013.01);
(Continued)

(58) Field of Classification Search
CPC ......... H01L 21/308–3088; H01L 21/31–3148; H01L 21/316–32155; H01L 21/823431; H01L 21/823821; H01L 21/845; H01L 29/66795–66818; H01L 29/7854; H01L 29/7858; H01L 21/3065; H01L 21/30655; H01L 21/311–31116; H01L 21/321; H01L 21/3213; H01L 21/32133; H01L 21/32135; H01L 21/32136; H01L 21/32137; H01L 29/0653; H01L 29/0843; H01L 29/0865; H01L 29/0869; H01L 29/0873;
(Continued)

(56) References Cited

U.S. PATENT DOCUMENTS

| | | | |
|---|---|---|---|
| 7,718,538 B2 * | 5/2010 | Kim | H01L 21/31116 438/714 |
| 8,962,400 B2 | 2/2015 | Tsai et al. | |

(Continued)

*Primary Examiner* — Sonya McCall-Shepard
(74) *Attorney, Agent, or Firm* — McDermott Will & Emery LLP

(57) ABSTRACT

In a method of manufacturing a semiconductor device including a Fin FET, a fin structure extending in a first direction is formed over a substrate. An isolation insulating layer is formed over the substrate so that an upper portion of the fin structure is exposed from the isolation insulating layer. A gate structure extending in a second direction crossing the first direction is formed over a part of the fin structure. A fin mask layer is formed on sidewalls of a source/drain region of the fin structure. The source/drain region of the fin structure is recessed. An epitaxial source/drain structure is formed over the recessed fin structure. In the recessing the source/drain region of the fin structure, a plasma process combining etching and deposition processes is used to form a recess having a rounded corner shape in a cross section along the second direction.

20 Claims, 11 Drawing Sheets

(51) Int. Cl.
  *H01L 21/3065* (2006.01)
  *H01L 21/764* (2006.01)
  *H01L 29/06* (2006.01)
  *H01L 29/08* (2006.01)
  *H01L 29/45* (2006.01)
  *H01L 29/66* (2006.01)
  *H01L 21/762* (2006.01)
  *H01L 29/165* (2006.01)
  *H01L 21/8234* (2006.01)
  *H01L 21/8238* (2006.01)
  *H01L 27/088* (2006.01)
  *H01L 27/092* (2006.01)

(52) U.S. Cl.
  CPC ........ *H01L 21/764* (2013.01); *H01L 29/0653* (2013.01); *H01L 29/0847* (2013.01); *H01L 29/45* (2013.01); *H01L 29/66636* (2013.01); *H01L 29/66795* (2013.01)

(58) Field of Classification Search
  CPC ............. H01L 29/0882; H01L 29/0886; H01L 29/66636; H01L 21/823418; H01L 21/823814
  See application file for complete search history.

(56) References Cited

U.S. PATENT DOCUMENTS

| | | |
|---|---|---|
| 9,093,514 B2 | 7/2015 | Tsai et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,564,528 B2 | 2/2017 | Yu et al. |
| 9,576,814 B2 | 2/2017 | Wu et al. |
| 9,608,116 B2 | 3/2017 | Ching et al. |
| 9,812,363 B1 | 11/2017 | Liao et al. |
| 9,859,380 B2 | 1/2018 | Lee et al. |
| 10,068,905 B2 * | 9/2018 | Liaw ................ H01L 21/76232 |
| 2015/0187943 A1 * | 7/2015 | Lee ..................... H01L 21/0262 257/192 |
| 2017/0256456 A1 * | 9/2017 | Lee ..................... H01L 21/3083 |

* cited by examiner

METHOD OF MANUFACTURING A SEMICONDUCTOR DEVICE FOR RECESSED FIN STRUCTURE HAVING ROUNDED CORNERS

BACKGROUND

The disclosure relates to a semiconductor integrated circuit, and more particularly to a semiconductor device having an epitaxial source/drain (S/D) structure with voids and its manufacturing process. As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
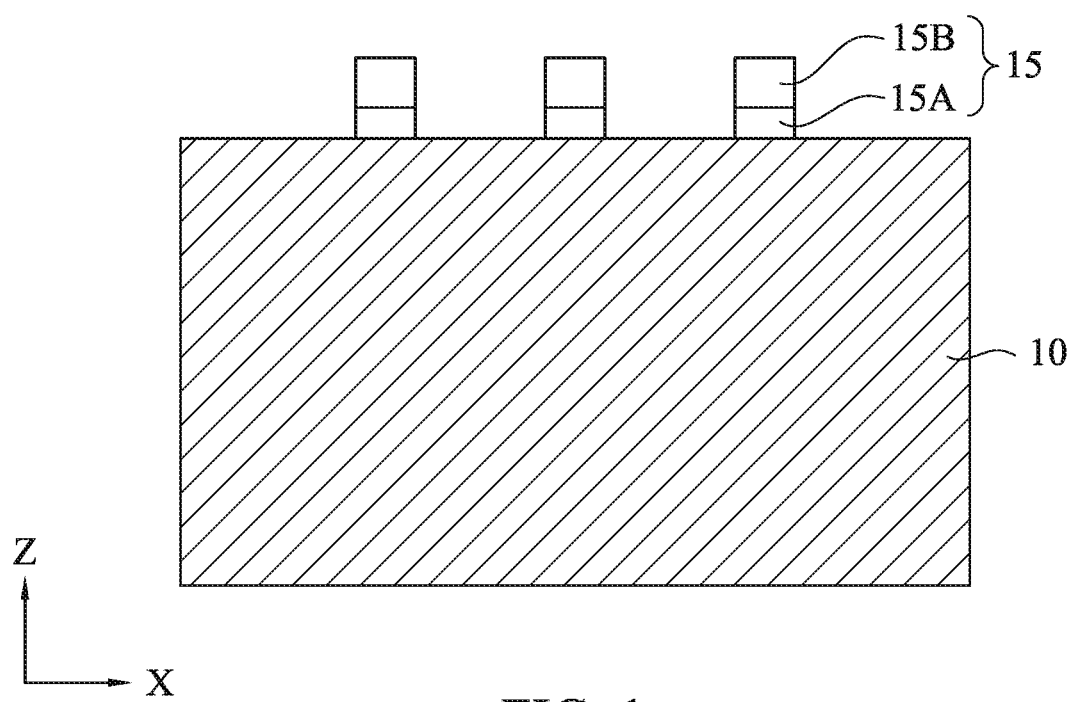
FIG. 1 shows a cross sectional view of one of the various stages of a manufacturing operation for a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C"

(A, B, C, A and B, A and C, B and C, or A, B and C), and does not mean one element from A, one element from B and one element from C, unless otherwise described. Materials, configurations, dimensions, processes and/or operations same as or similar to those described with one embodiment may be employed in the other embodiments and the detailed explanation may be omitted.

Disclosed embodiments relate to a semiconductor device and its manufacturing method, in particular, source/drain regions of a field effect transistor (FET). The embodiments such as those disclosed herein are generally applicable not only to FinFETs but also other FETs.

FIGS. 1-12 show cross sectional views of various stages for manufacturing a FinFET device according to an embodiment of the present disclosure. It is understood that additional operations can be provided before, during, and after processes shown by FIGS. 1-12, and some of the operations described below can be replaced or eliminated, for additional embodiments of the method. The order of the operations/processes may be interchangeable.

Fin structures for FinFETs can be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures. The multi-patterning processes combining photolithography and self-aligned processes generally result in forming a pair of fin structures.

In some embodiments, a mask layer 15 is formed over a substrate 10 to fabricate fin structures. The mask layer 15 is formed by, for example, a thermal oxidation process and/or a chemical vapor deposition (CVD) process. The substrate 10 is, for example, a p-type silicon or germanium substrate with an impurity concentration in a range from about $1\times10^{15}$ cm$^{-3}$ to about $1\times10^{16}$ cm$^{-3}$. In other embodiments, the substrate is an n-type silicon or germanium substrate with an impurity concentration in a range from about $1\times10^{15}$ cm$^{-3}$ to about $1\times10^{16}$ cm$^{-3}$.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer 15 includes, for example, a pad oxide (e.g., silicon oxide) layer 15A and a silicon nitride mask layer 15B in some embodiments. The pad oxide layer 15A may be formed by using thermal oxidation or a CVD process. The silicon nitride mask layer 15B may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 15A is in a range from about 2 nm to about 15 nm and the thickness of the silicon nitride mask layer 15B is in a range from about 2 nm to about 50 nm in some embodiments. A mask pattern is further formed over the mask layer. The mask pattern is, for example, a resist pattern formed by lithography operations.

By using the mask pattern as an etching mask, a hard mask pattern 15 of the pad oxide layer and the silicon nitride mask layer is formed, as shown in FIG. 1.

Figure 2:
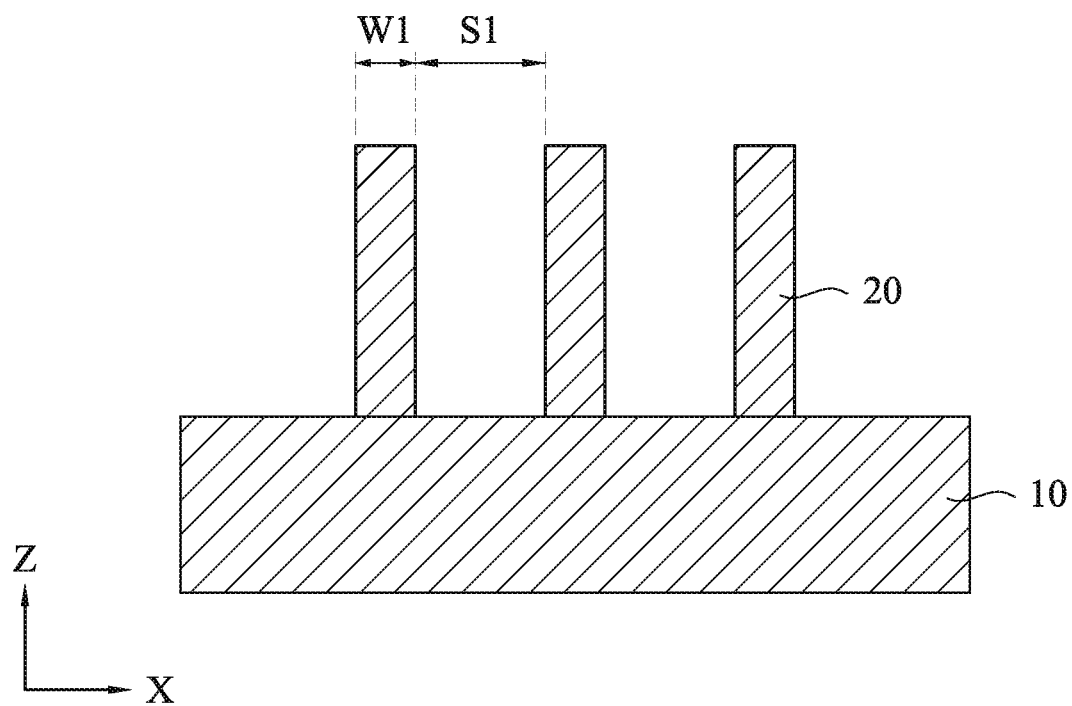
FIG. 2 shows a cross sectional view of one of the various stages of a manufacturing operation for a semiconductor device according to an embodiment of the present disclosure.

Then, as shown in FIG. 2, by using the hard mask pattern 15 as an etching mask, the substrate 10 is patterned into fin structures 20 by trench etching using a dry etching method and/or a wet etching method.

In FIG. 2, three fin structures 20 are disposed over the substrate 10. However, the number of the fin structures is not limited to three. The numbers may be as small as one or more than three. In some embodiments, the number of fin structures is in a range from 5 to 1000, which are connected by a source/drain epitaxial layer formed in subsequent operations. In other embodiments, the number of fin structures is in a range from 5 to 100, which are connected by source/drain epitaxial layer formed in subsequent operations. In certain embodiments, the number of fin structures is in a range from 5 to 20, which are connected by a source/drain epitaxial layer formed in subsequent operations. In addition, one or more dummy fin structures may be disposed adjacent both sides of the fin structure 20 to improve pattern fidelity in patterning processes.

The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The width W1 of the fin structure 20 is in a range from about 5 nm to about 40 nm in some embodiments, and is in a range from about 7 nm to about 12 nm in other embodiments. The space S1 between two fin structures is in a range from about 10 nm to about 50 nm in some embodiments. The height (along the Z direction) of the fin structure 20 is in a range from about 100 nm to about 300 nm in some embodiments, and is in a range from about 50 nm to 100 nm in other embodiments.

The lower part of the fin structure 20 under the gate structure 40 (see, FIG. 5A) may be referred to as a well region, and the upper part of the fin structure 20 may be referred to as a channel region. Under the gate structure 40, the well region is embedded in the isolation insulating layer 30 (see, FIG. 5A), and the channel region protrudes from the isolation insulating layer 30. A lower part of the channel region may also be embedded in the isolation insulating layer 30 to a depth of about 1 nm to about 5 nm.

The height of the well region is in a range from about 60 nm to 100 nm in some embodiments, and the height of the channel region is in a range from about 40 nm to 60 nm, and is in a range from about 38 nm to about 55 nm in other embodiments.

Figure 3:
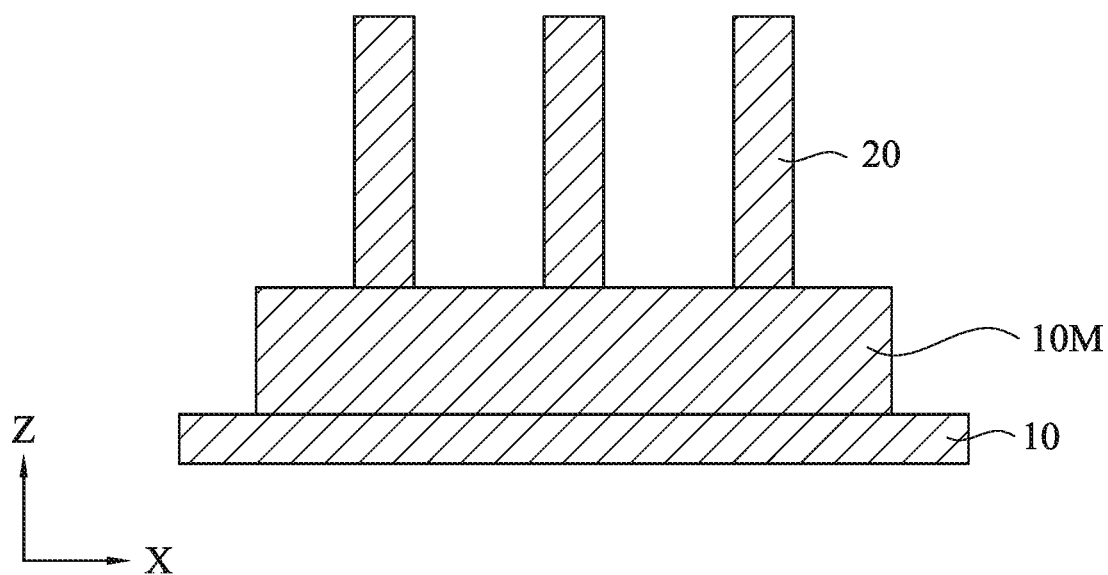
FIG. 3 shows a cross sectional view of one of the various stages of a manufacturing operation for a semiconductor device according to an embodiment of the present disclosure.

After the fin structures 20 are formed, the substrate 10 is further etched to form a mesa shape 10M in some embodiments, as shown in FIG. 3. In other embodiments, the mesa shape 10M is first formed, and then the fin structures 20 are formed. In certain embodiments, no mesa shape is formed.

After the fin structures 20 and the mesa shape 10M are formed, the isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous.

Figure 4:
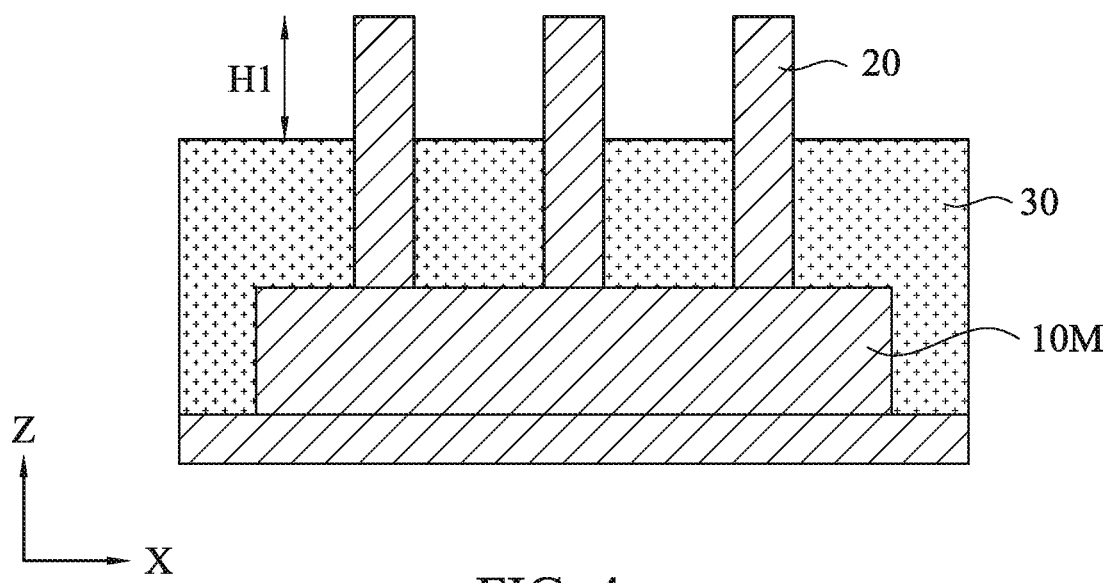
FIG. 4 shows a cross sectional view of one of the various stages of a manufacturing operation for a semiconductor device according to an embodiment of the present disclosure.

The insulating layer 30 is first formed in a thick layer so that the fin structures are embedded in the thick layer, and the thick layer is recessed so as to expose the upper portions of the fin structures 20, as shown in FIG. 4. The height H1 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

Figure 5A:
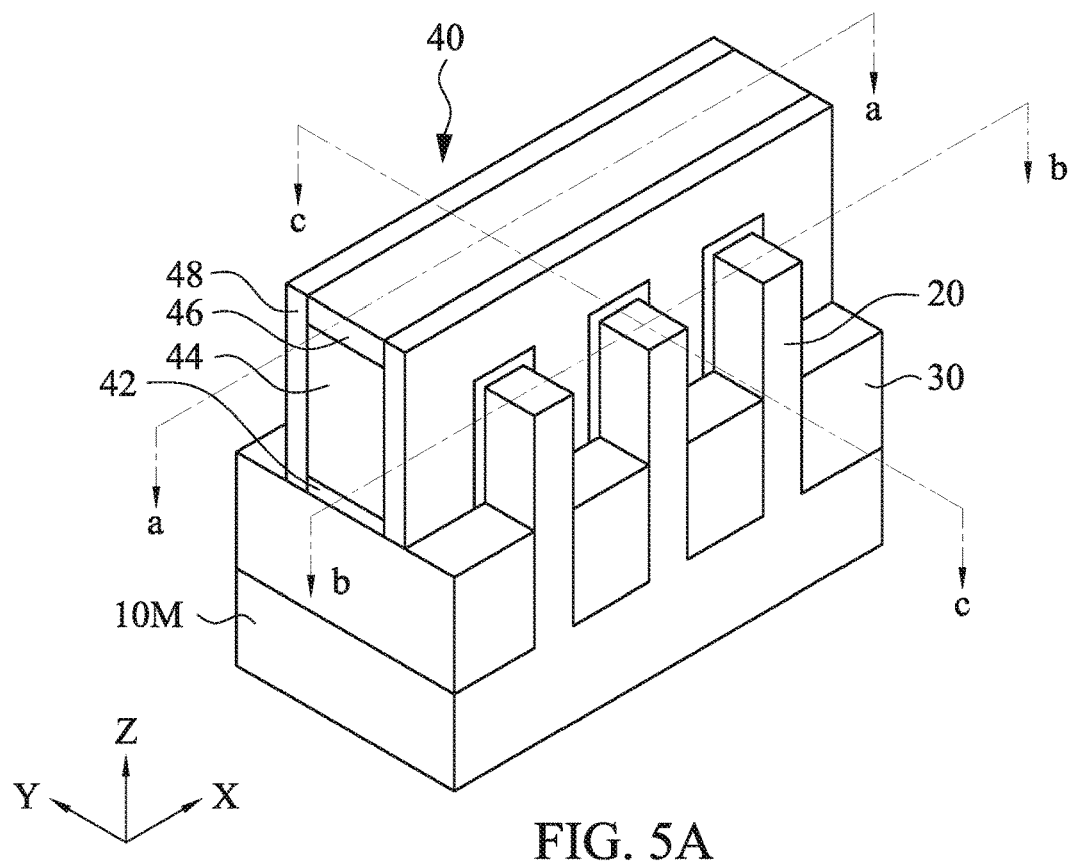
FIGS. 5A, 5B and 5C show views of one of the various stages of a manufacturing operation for a semiconductor device according to an embodiment of the present disclosure.
Figure 5B:
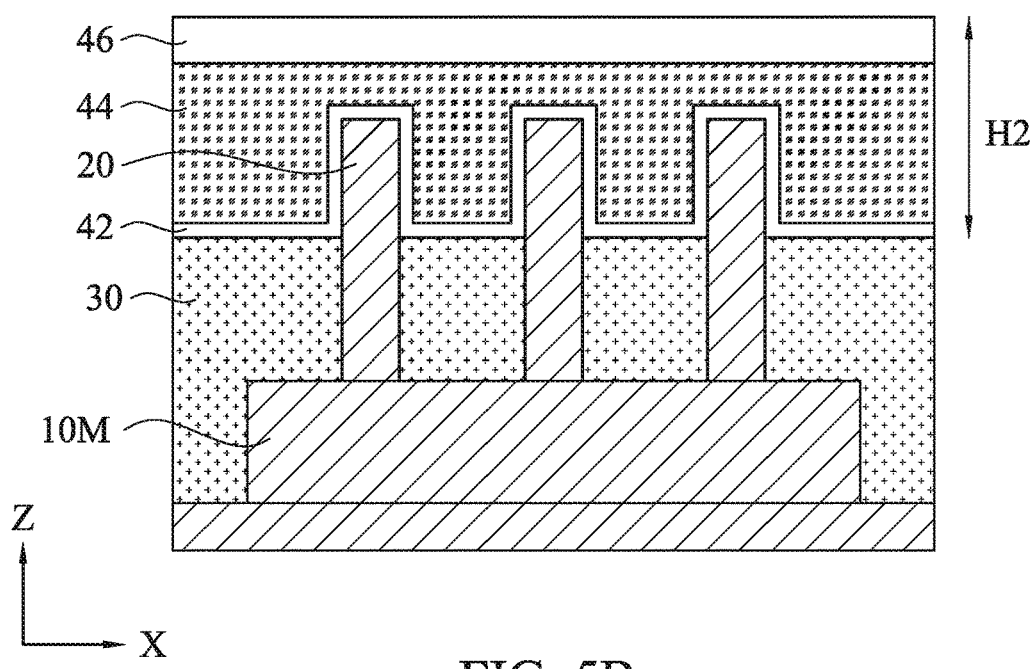
Figure 5C:
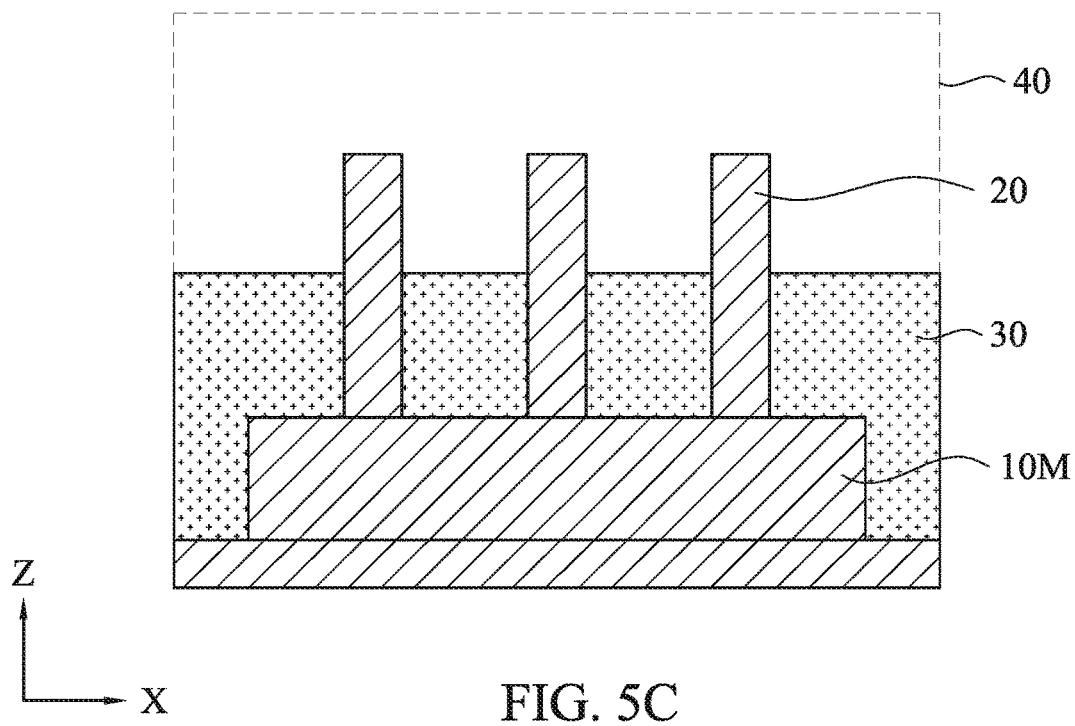

After the insulating layer 30 is formed, a gate structure 40 is formed over the fin structures 20, as shown in FIGS. 5A-5C. FIG. 5A is an exemplary perspective view, FIG. 5B is an exemplary cross sectional view along line a-a of FIG. 5A and FIG. 5C is an exemplary cross sectional view along line b-b of FIG. 5A. FIGS. 6, 7A, 8A and 9-12 are also cross sectional views along line b-b of FIG. 5A. FIGS. 7B and 8B are cross sectional views along line c-c of FIG. 5A.

As shown in FIG. 5A, the gate structure 40 extends in the X direction, while the fin structures 20 extend in the Y direction.

To fabricate the gate structure 40, a dielectric layer and a poly silicon layer are formed over the isolation insulating layer 30 and the exposed fin structures 20, and then patterning operations are performed so as to obtain gate structures including a gate pattern 44 made of poly silicon and a dielectric layer 42. In some embodiments, the polysilicon layer is patterned by using a hard mask and the hard mask remains on the gate pattern 44 as a cap insulating layer 46. The hard mask (cap insulating layer 46) includes one or more layers of insulating material. The cap insulating layer 46 includes a silicon nitride layer formed over a silicon oxide layer in some embodiments. In other embodiments, the cap insulating layer 46 includes a silicon oxide layer formed over a silicon nitride layer. The insulating material for the cap insulating layer 46 may be formed by CVD, PVD, ALD, e-beam evaporation, or other suitable process. In some embodiments, the dielectric layer 42 may include one or more layers of silicon oxide, silicon nitride, silicon oxy-nitride, or high-k dielectrics. In some embodiments, a thickness of the dielectric layer 42 is in a range from about 2 nm to about 20 nm, and in a range from about 2 nm to about 10 nm in other embodiments. The height H2 of the gate structures is in a range from about 50 nm to about 400 nm in some embodiments, and is in a range from about 100 nm to 200 nm in other embodiments.

In some embodiments, a gate replacement technology is employed. In such a case, the gate pattern 44 and the dielectric layer 42 are a dummy gate electrode and a dummy gate dielectric layer, respectively, which are subsequently removed. If a gate-first technology is employed, the gate pattern 44 and the dielectric layer 42 are used as a gate electrode and a gate dielectric layer.

Further, gate sidewall spacers 48 are formed on both sidewalls of the gate pattern. The sidewall spacers 48 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers 48 are formed by forming a blanket layer of insulating material with or without post anisotropic etching. In one embodiment, the sidewall spacer layers are made of silicon nitride based material, such as SiN, SiON, SiOCN or SiCN.

Figure 6:
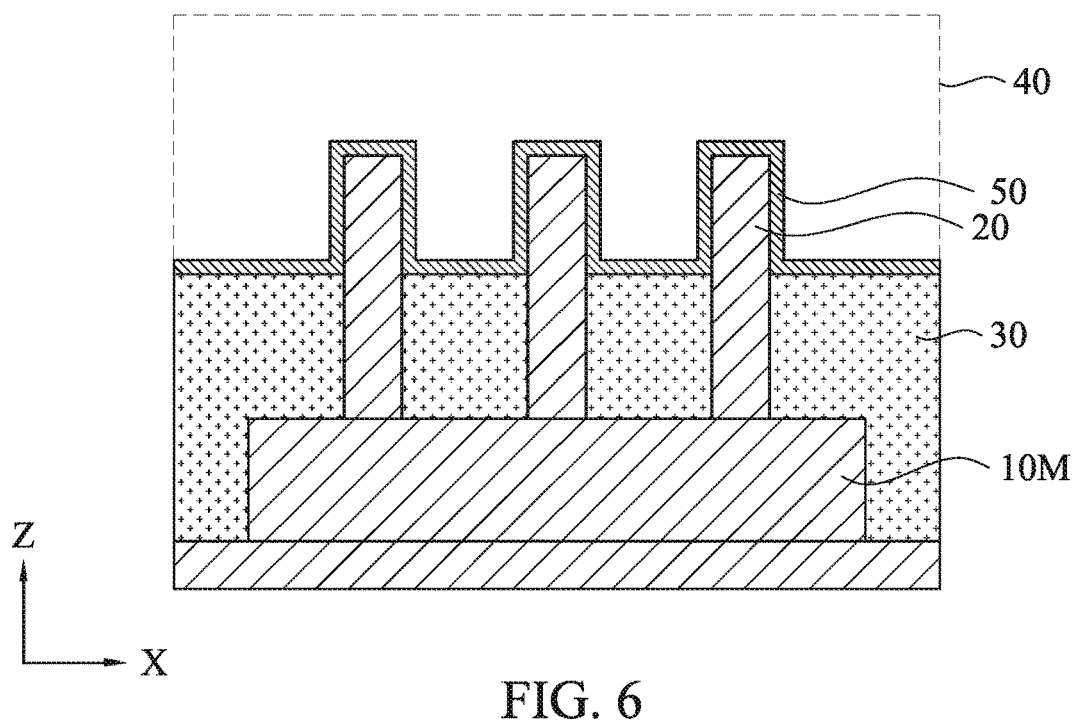
FIG. 6 shows a cross sectional view of one of the various stages of a manufacturing operation for a semiconductor device according to an embodiment of the present disclosure.

Then, as shown in FIG. 6, a fin mask layer 50 is formed over the fin structures 20. The fin mask layer 50 is made of dielectric material including silicon nitride based material, such as SiN, SiON, SiOCN or SiCN. In one embodiment, SiN is used as the fin mask layer 50. The fin mask layer 50 is formed by CVD, PVD, ALD, e-beam evaporation, or other suitable process. The thickness of the fin mask layer 50 is in a range from about 3 nm to about 30 nm in some embodiments.

In some embodiments, the fin mask layer 50 and the sidewall spacers 48 for the gate structure are separately formed. In other embodiments, the same blanket layer is used for the fin mask layer 50 and the sidewall spacers 48.

After forming the fin mask layer 50, the upper portion of the fin structures 20 are recessed and a part of the fin mask layer 50 disposed on side surfaces and the top surface of the fin structures protruding from the isolation insulating layer are removed by a dry etching and/or a wet etching operation. The upper portion of the fin structures 20 are recessed (etched) down to the level equal to or below the upper surface of the fin mask layer 50 on the upper surface isolation insulating layer 30, as shown in FIGS. 7A and 7B.

Figure 7A:
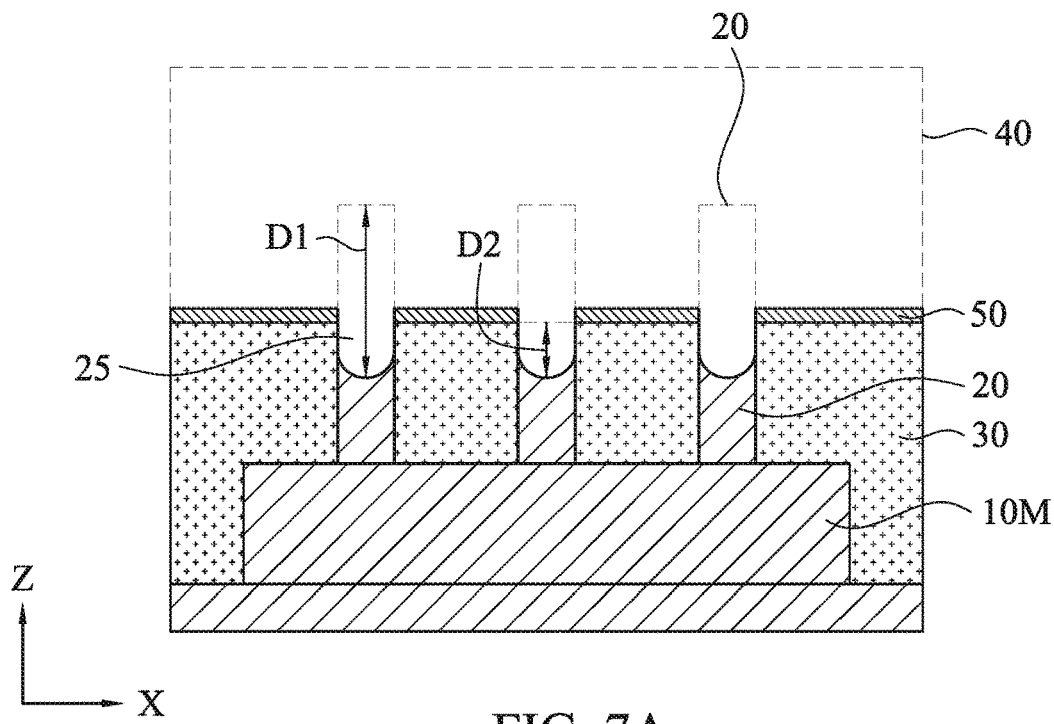
FIGS. 7A and 7B show cross sectional views of one of the various stages of a manufacturing operation for a semiconductor device according to an embodiment of the present disclosure.
Figure 7B:
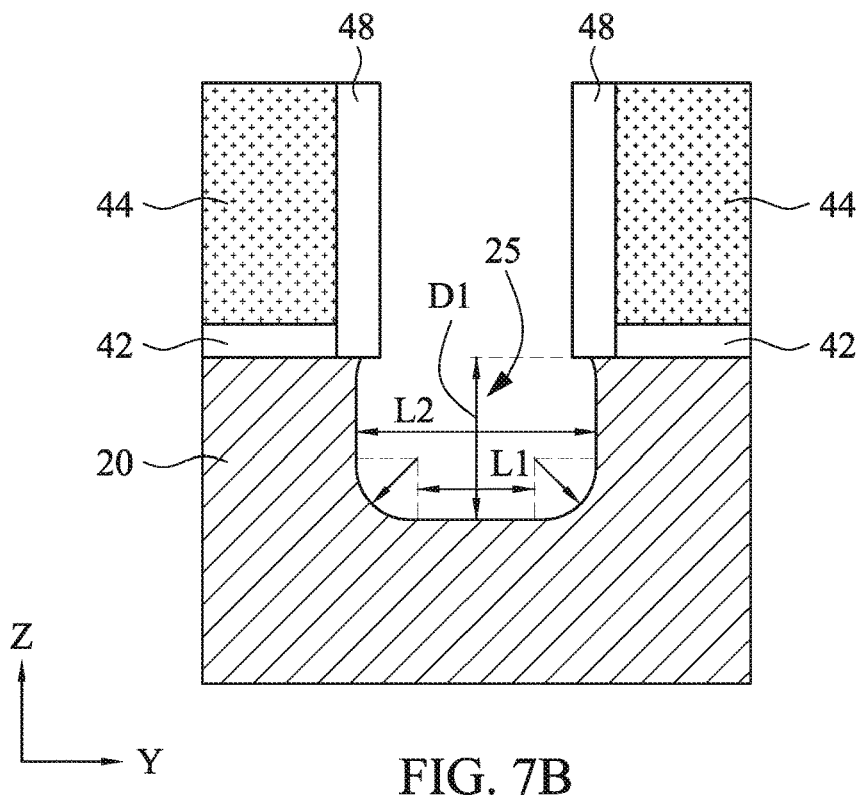

In some embodiments, the top of the recessed fin structure 20 (the bottom of the recess 25) has a U-shape, semi-circular or bullet head shape (may be collectively referred to as a rounded corner shape), as shown in FIG. 7A, which is a cross sectional view along the gate extension direction (X). A V-shape and a rectangular shape are excluded from the rounded corner shape in some embodiments. In some embodiments, no flat or linear portion exists in the cross sectional view of the top of the recessed fin structure along the X direction, in a case of, for example, a semi-circular shape and a bullet head shape. In a case of a bullet head shape, two curves meet at the bottom of the recess forming an apex. In other embodiments, there is a small flat or liner portion having a length in a range from about 0.5 nm to about 2 nm, in the case of, for example, a U-shape. In some embodiments, the rounded corner shape is other than a semi-circular shape having a constant radius. In some embodiments, the curved or rounded portions (other than straight portions) do not have a constant radius or curvature. In some embodiments, a maximum radius of the rounded corners is in a range from about 0.5 nm to about 2 nm in some embodiments.

Along the Y direction, which is the source-to-drain direction, the recess or the top of the recessed fin structure 20 also has a U-shape having rounded corners and a flat or a linear bottom portion. In some embodiments, the width L1 of the flat or linear bottom portion is about 10% to about 90% of the largest width L2 of the recess 25 in the Y direction. In other embodiments, L1 is about 30% to 70% of L2. In some embodiments, L1 is in a range from about 2 nm to about 20 nm. In certain embodiments, no flat or linear portion exists, i.e., L1=0.

In some embodiments, the depth D0 of the recess 25 measured from the topmost surface of the fin structure 20 is in a range from about 5 nm to about 60 nm in some embodiments, and is in a range from about 10 nm to about 15 nm in other embodiments. In some embodiments, the depths of recesses 25 among multiple fin structures 20 vary. In some embodiments, the variations in terms of difference between the maximum depth and the minimum depth is about 0.5 nm to about 2.5 nm in some embodiments. In some embodiments, a depth D2 of the recess 25 measured from a topmost surface of the isolation insulating layer 30 to a bottommost surface of the recess 25 is in a range from about 10 nm to about 15 nm. In some embodiments, a depth D1 of the recess measured from a topmost portion of the recess of the recess 25 (at the edge of recessed portion) is in a range from about 5 nm to 10 nm. In some embodiments, a ratio of D1/D2 is in a range from about 1.9 to about 1.14. If the ratio of D1/D2 is greater than 1.9, it increases difficulty in the subsequent epitaxial growth process. If the ratio of D1/D2 is smaller than 1.14, a strain induced by a source/drain feature is reduced, resulting in a low carrier mobility. In at least one embodiment, the range of D1/D2 is shown with respect to a cross-sectional view along a direction of a fin structure or with respect to a cross-sectional view along a direction of a gate structure.

As shown in FIG. 7B, the recess laterally penetrates a portion of the fin structure under the sidewall spacer 48 in some embodiments. In other embodiments, the recess extends laterally under a portion of the dummy gate electrode 44.

In some embodiments, when another gate structure 40 is disposed over the fin structure 20, a portion of the fin structure 20 from one gate structure to another gate structure is recessed as shown in FIG. 7B. In other embodiments, one end (e.g., right end in FIG. 7B) of the recess 25 is defined by the isolation insulating layer 30. Accordingly, the dimension of the recess at this end is defined by a self-aligned manner.

Figure 17:
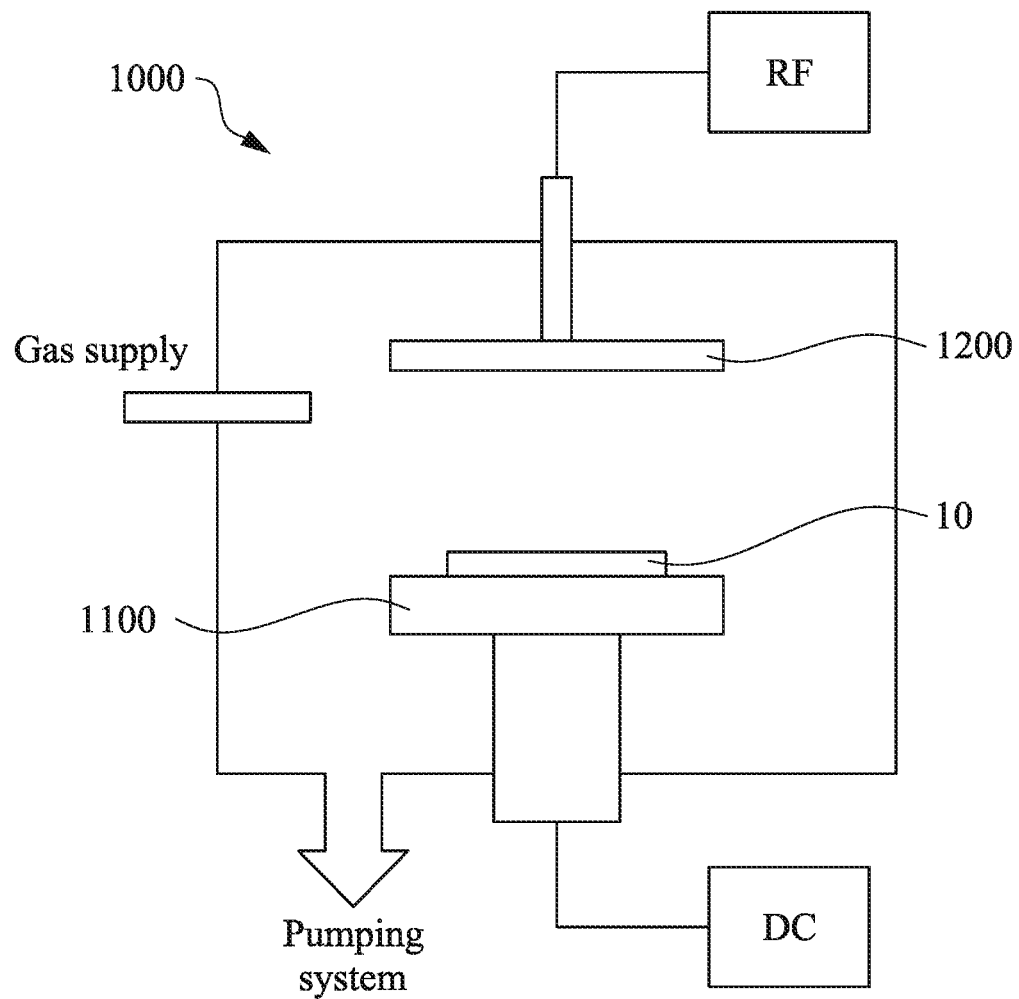
FIG. 17 shows a schematic view of an etching apparatus according to an embodiment of the present disclosure.

The fin structures 20 are recessed to form the rounded corner shape by using a pulsed-bias etching operation using a plasma etching apparatus 1000 shown in FIG. 17. In some embodiments, the substrate 10 is placed on a wafer stage 1100 of an etching chamber, and the substrate 10 and/or the wafer stage 1100 is biased with, for example, DC voltage. RF power is applied to a counter electrode 1200 which is disposed above the substrate in some embodiments. In other embodiments, the RF power is applied via a coil surrounding the etching chamber.

In some embodiments, the etching gas includes a halogen containing gas, such as HBr. In some embodiments, HBr is diluted with an inert gas, such as He and/or Ar. In some embodiments, HBr is diluted with nitrogen ($N_2$). In some embodiments, a ratio of HBr to the dilution gas is in a range from about 0.3 to about 0.7, and in other embodiments, the ratio is in a range from about 0.4 to about 0.6. If the ratio is greater than 0.7, a etch rate is too fast to control and if the ratio is smaller than 0.3, it increases manufacturing time, resulting in a cost increase.

In some embodiments, during an etching operation, the plasma chamber is maintained at a pressure in a range from about 1 mTorr to about 100 mTorr by a pumping system. In other embodiments, the pressure during the etching operation is in a range from about 3 mTorr to about 15 mTorr.

The bias voltage is in a range from about 300V to about 800V in some embodiments, and is in a range from about 500 V to 600V in other embodiments. The input RF power is in a range from about 300 W to about 800 W in some embodiments. The frequency of the RF is 13.56 MHz, 2.56 GHz or any other suitable frequencies used in the semiconductor industries.

In some embodiments, the bias voltage is pulsed voltage having a duty ratio (on-to-off ratio) in a range from about 10% to about 90%. In other embodiments, the duty ratio is in a range from about 30% to about 70%. In some embodiments, a unit cycle (one "on" period and one "off" period) is in a range from about 0.5 sec to 10 sec, and is in a range from about 1 sec to 5 sec. In some embodiments, the pulsed-bias etching is a repetition of etching and deposition operations. During the "on" period, the fin structures are etched and during the "off" period, the rate of deposition of bi-products is greater than the etching rate. Thus, by adjusting the duty ratio, RF power and/or bias voltage, it is possible to form the rounded corner shape as shown in FIG. 7A.

In some embodiments, the fin mask layer 50 is fully removed. In other embodiments, by adjusting the etching conditions, for example, an over-etching time, the fin mask layer 50 remains on the upper surface of the isolation insulating layer 30. The thickness of the remaining fin mask layer 50 is in a range from about 2 nm to about 10 nm in some embodiments.

Figure 8A:
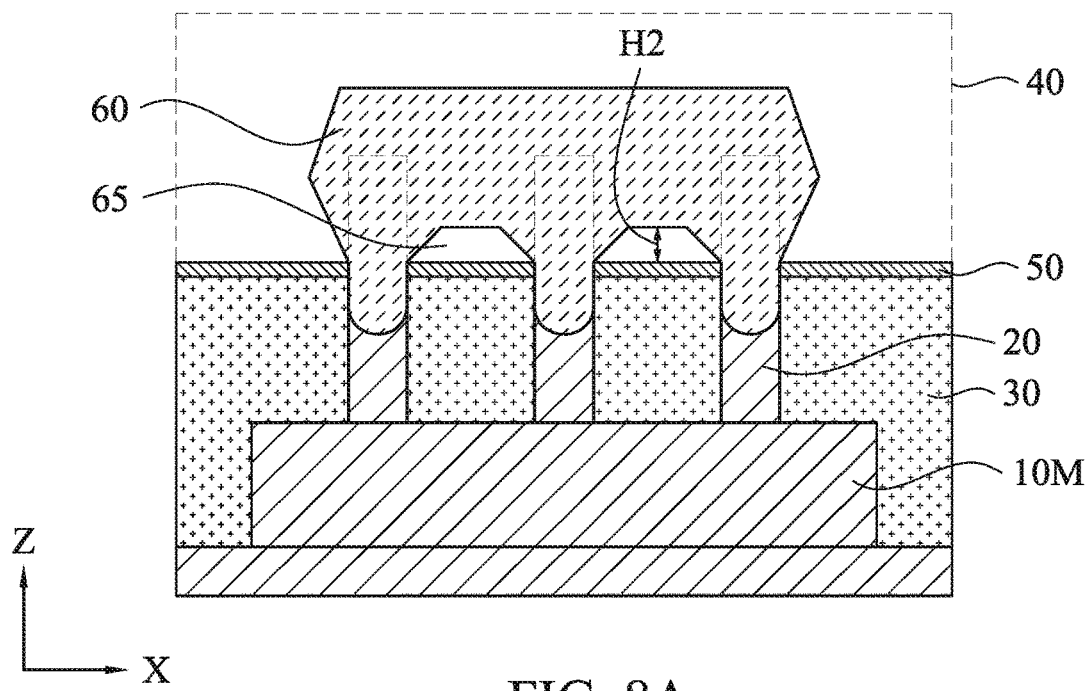
FIGS. 8A and 8B show cross sectional views of one of the various stages of a manufacturing operation for a semiconductor device according to an embodiment of the present disclosure.
Figure 8B:
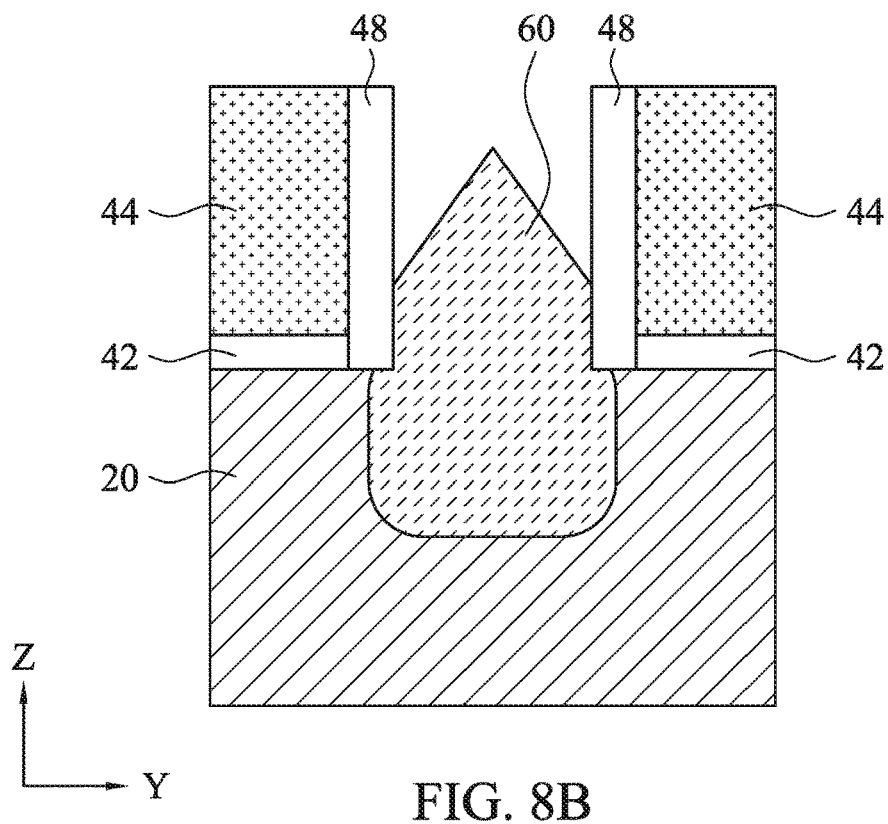

Then, as shown in FIGS. 8A and 8B, an epitaxial source/drain structure 60 is formed over the recessed fin structures 20. The epitaxial source/drain structure 60 is made of one or more layers of semiconductor material having a different lattice constant than the fin structures 20 (channel regions). When the fin structures are made of Si, the epitaxial source/drain structure 60 includes SiP, SiC or SiCP for an n-channel Fin FET and SiGe or Ge for a p-channel Fin FET. The epitaxial source/drain structure 60 is epitaxially formed over the upper portions of the recessed fin structures. Due to the crystal orientation of the substrate formed into the fin structures 20 (e.g., (100) plane), the epitaxial source/drain structure 60 grows laterally and has a diamond-like shape.

The source/drain epitaxial layer 60 may be grown at a temperature of about 600 to 800° C. under a pressure of about 80 to 150 Torr, by using a Si containing gas, such as $SiH_4$, $Si_2H_6$ or $SiCl_2H_2$; a Ge containing gas, such as $GeH_4$, $Ge_2H_6$ or $GeCl_2H_2$; a C containing gas, such as $CH_4$ or $C_2H_6$; and/or a dopant gas, such as $PH_3$. The source/drain structure for an n-channel FET and the source/drain structure for a p-channel FET may be formed by separate epitaxial processes.

Due to the relatively small space between the fin structures and the fin mask layer 50 remaining on the upper surface of the isolation insulating layer between the fin structures and the rounded corner shape of the recessed fin structures 20, the adjacent epitaxial source/drain structures formed over each of the first fin structures 20 are merged such that a void or a gap (an air gap) 65 is formed by the merged second epitaxial source/drain structure 60 and the fin mask layer 50 on the upper surface of the isolation insulating layer 30, as shown in FIG. 8A.

When the fin mask layer remains, due to the fin mask layer 50 on the upper surface of the isolation insulating layer 30, the height H2 of the void 65 is larger than the case where no fin mask layer 50 remains on the upper surface of the isolation insulating layer 30. In some embodiments, the height H2 of the void is in a range from about 10 nm to about 30 nm measured from the upper surface of fin mask layer 50, and in a range from about 15 nm to about 25 nm in other embodiments. In addition, due to the remaining fin mask layer 50, the isolation insulating layer 30 is protected during the fin etching. In some embodiments, no fin mask layer 50 remains.

Figure 9:
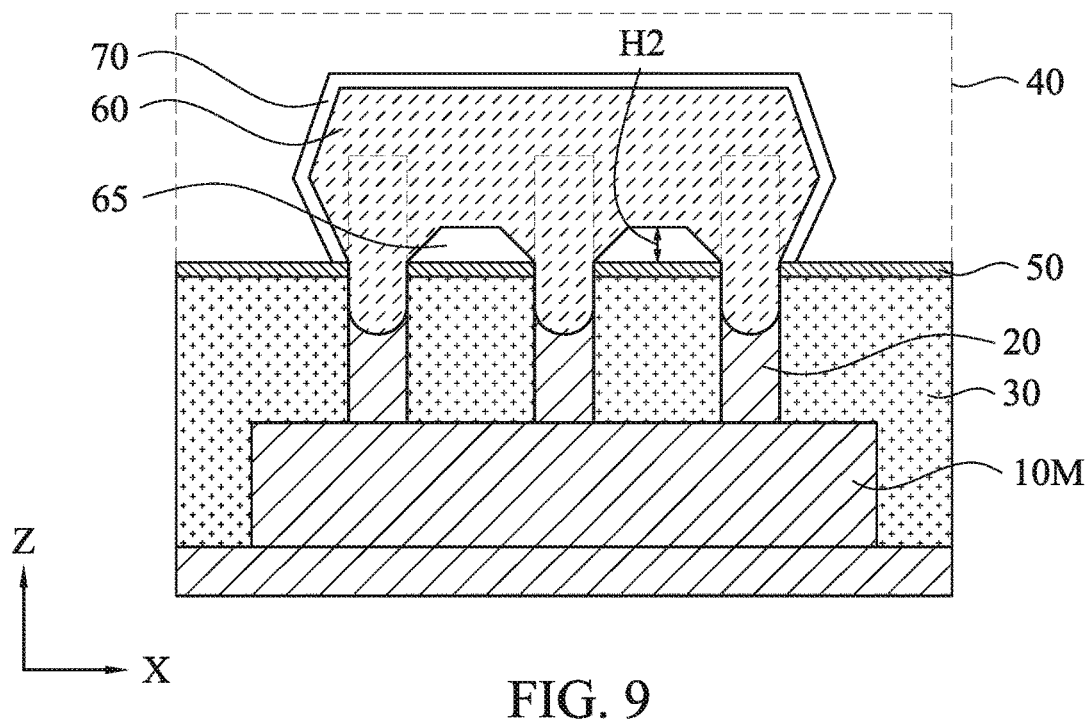
FIG. 9 shows a cross sectional view of one of the various stages of a manufacturing operation for a semiconductor device according to an embodiment of the present disclosure.

After the epitaxial source/drain structure 60 is formed, as shown in FIG. 9, a silicide layer 70 is formed over the epitaxial source/drain structure 60.

A metal material, such as Ni, Ti, Ta and/or W, is formed over the epitaxial source/drain structure 60, and an annealing operation is performed to form a silicide layer 70. In other embodiments, a silicide material, such as NiSi, TiSi, TaSi and/or WSi, is formed over the epitaxial source/drain structure 60, and an annealing operation may be performed. The annealing operation is performed at a temperature of about 250° C. to about 850° C. The metal material or the silicide material is formed by CVD or ALD. The thickness of the silicide layer 70 is in a range from about 4 nm to about 10 nm in some embodiments. Before or after the annealing operations, the metal material or the silicide material formed over the isolation insulating layer 30 is selectively removed.

Figure 10:
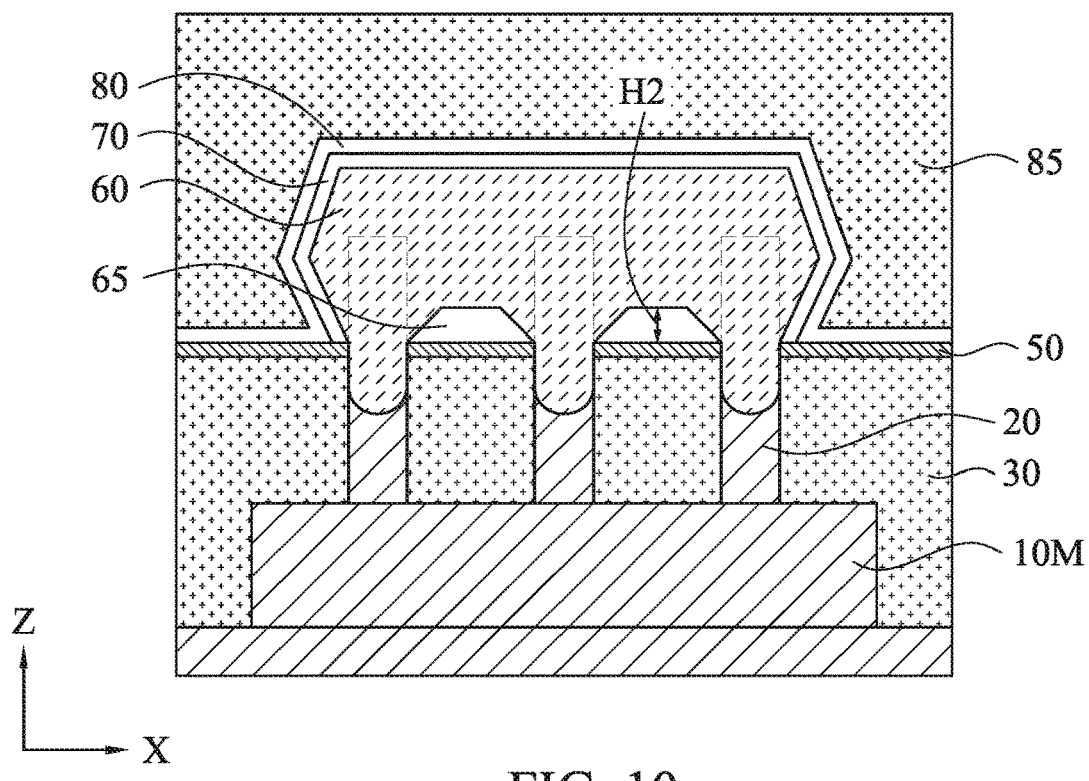
FIG. 10 shows a cross sectional view of one of the various stages of a manufacturing operation for a semiconductor device according to an embodiment of the present disclosure.
Figure 11:
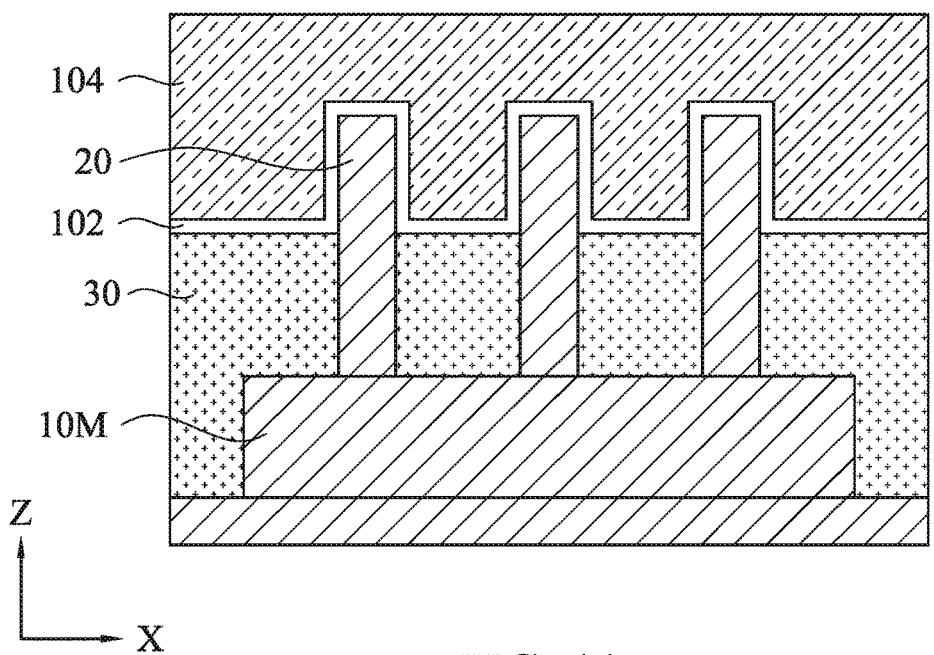
FIG. 11 shows a cross sectional view of one of the various stages of a manufacturing operation for a semiconductor device according to an embodiment of the present disclosure.

Then, as shown in FIG. 10, an insulating layer 80, functioning as a contact etching stop layer, is formed over the metal gate structure and the source/drain structures 60, and then an interlayer dielectric layer 85 is formed. The insulating layer 80 is one or more layers of insulating material. In one embodiment, the insulating layer 80 is made of silicon nitride formed by CVD. The materials for the interlayer dielectric layer 85 include compounds comprising Si, O, C and/or H, such as silicon oxide, SiCOH and SiOC. Organic materials, such as polymers, may be used for the interlayer dielectric layer 85.

Then, a metal gate structure is formed by using a gate replacement technology. After forming the interlayer dielectric layer 85, a CMP operation is performed to expose the dummy gate electrode 44. The dummy gate structures (dummy gate electrode 44 and dummy gate dielectric layer 42) are then removed and replaced with a metal gate structures (metal gate electrode and gate dielectric layer).

The dummy gate electrode 44 and the dummy gate dielectric layer 42 are removed, by appropriate etching processes, respectively, to form a gate opening. Metal gate structures including a gate dielectric layer 102 and metal gate electrode 104 are formed in the gate openings.

The gate dielectric layer 102 is formed over an interface layer (not shown) disposed over the channel layer of the fin structures 20 in some embodiments. The interface layer may include silicon oxide or germanium oxide with a thickness of 0.2 nm to 1.5 nm in some embodiments. In other embodiments, the thickness of the interface layer is in a range about 0.5 nm to about 1.0 nm.

The gate dielectric layer 102 includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments.

The metal gate electrode 104 is formed over the gate dielectric layer. The metal gate electrode 104 includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) are interposed between the gate dielectric layer and the metal gate electrode. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

After depositing appropriate materials for the metal gate structures, planarization operations, such as CMP, are performed.

After the metal gate structure is formed, one or more interlayer dielectric layer is formed over the metal gate structure and the interlayer dielectric layer 85. The interlayer dielectric layers are collectively referred to as interlayer dielectric layer 86 as shown in FIG. 12.

Figure 12:
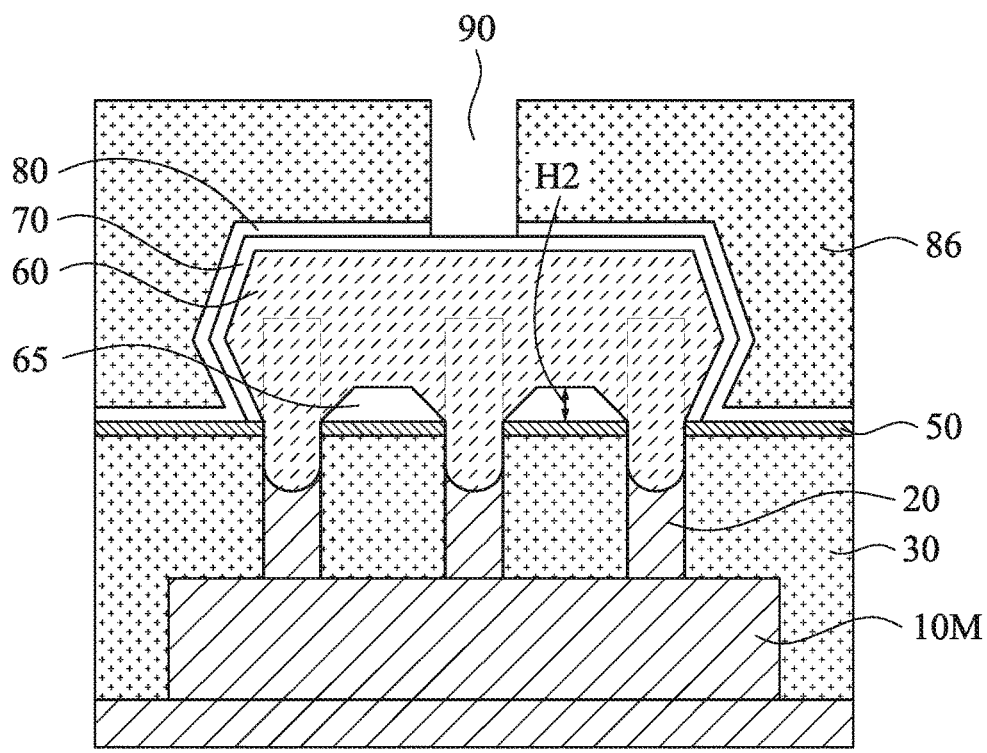
FIG. 12 shows a cross sectional view of one of the various stages of a manufacturing operation for a semiconductor device according to an embodiment of the present disclosure.

By using a patterning operation including lithography, a contact hole 90 is formed in the interlayer dielectric layer 86 and the insulating layer 80 so as to expose the epitaxial source and drain structures 60 with the silicide layer 70, as shown in FIG. 12.

Figure 13:
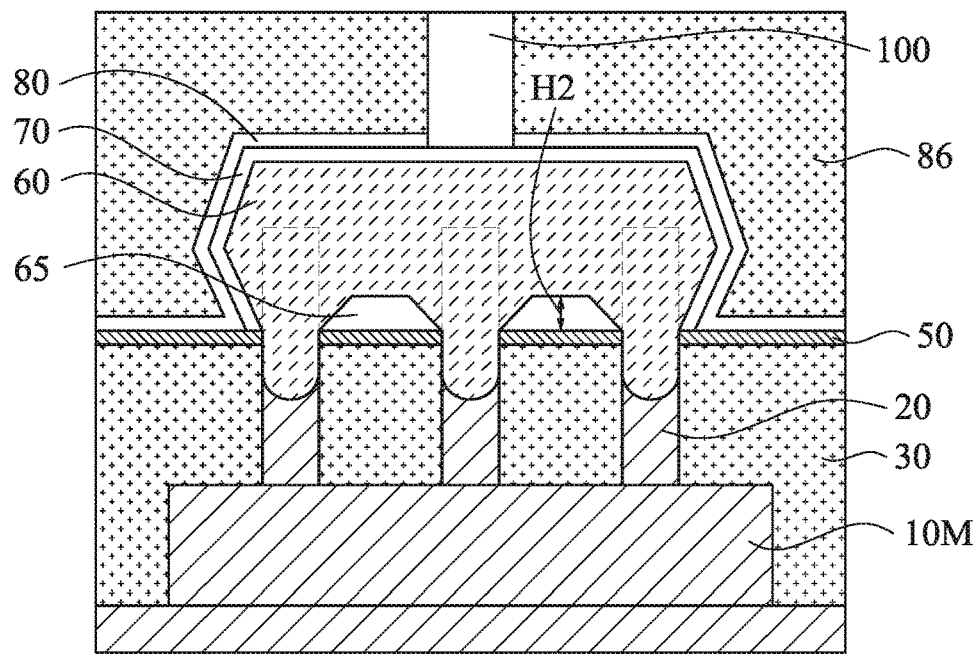
FIG. 13 shows a cross sectional view of one of the various stages of a manufacturing operation for a semiconductor device according to an embodiment of the present disclosure.

Then, the contact hole is filled with a conductive material, thereby forming a contact plug 100, as shown in FIG. 13. The contact plug 100 may include a single layer or multiple layers of any suitable metal such as Co, W, Ti, Ta, Cu, Al and/or Ni and/or nitride thereof.

After forming the contact plug, further CMOS processes are performed to form various features such as additional interlayer dielectric layer, contacts/vias, interconnect metal layers, and passivation layers, etc.

In some embodiments, the silicide layer 70 is formed after the contact hole 90 is opened. In such a case, after forming the epitaxial source/drain structure 60 as shown in FIGS. 8A and 8B, the metal gate structures, the insulating layer 80 (contact etching stop layer) and the interlayer dielectric layer 86 are formed, without forming a silicide layer. Then, a contact hole is formed in the insulating layer 80 and the interlayer dielectric layer 86 to expose the upper surface of the epitaxial source/drain structure 60, and then a silicide layer is formed on the upper surface of the epitaxial source/drain structure 60. After forming the silicide layer, the conductive material is formed in the contact hole, thereby forming a contact plug.

Figure 14:
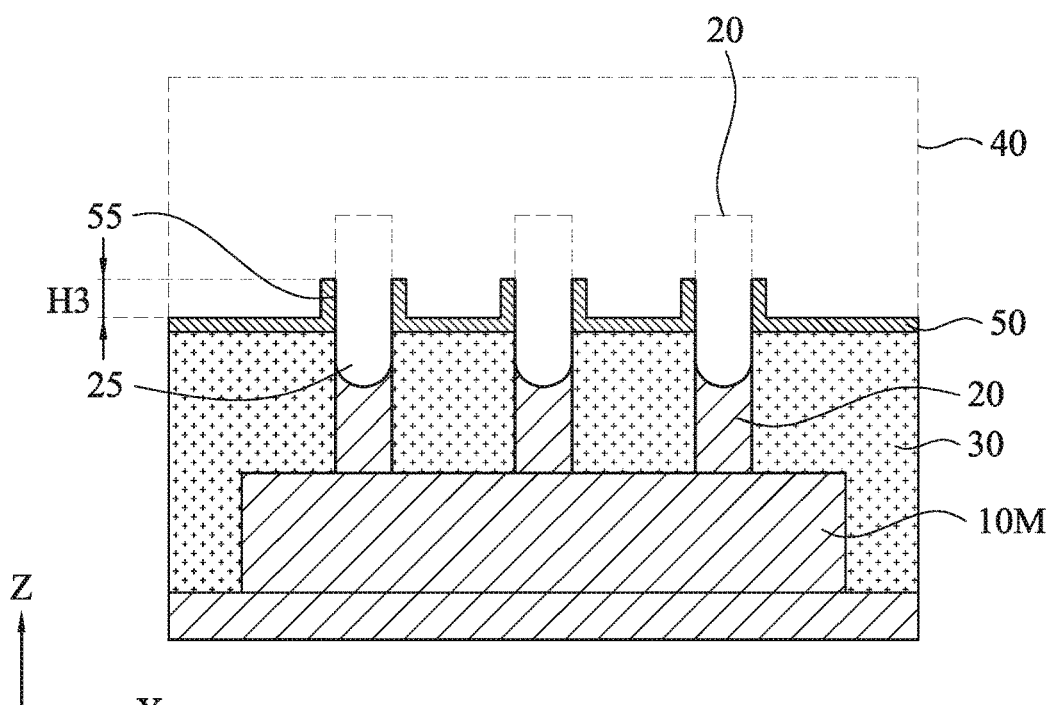
FIG. 14 shows a cross sectional view of one of the various stages of a manufacturing operation for a semiconductor device according to an embodiment of the present disclosure.
Figure 15:
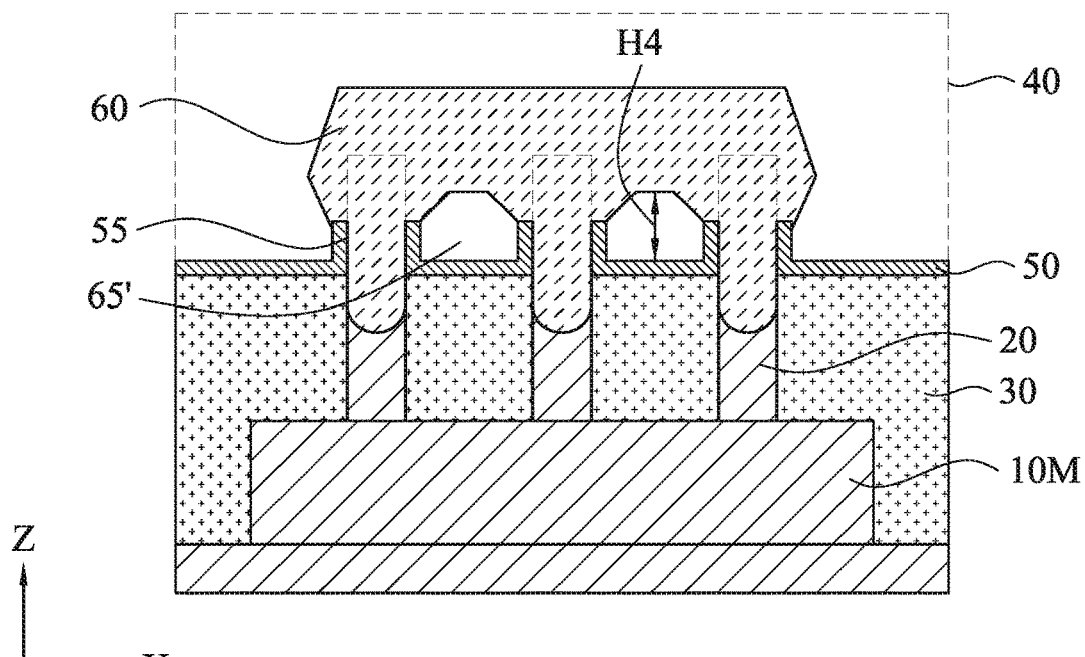
FIG. 15 shows a cross sectional view of one of the various stages of a manufacturing operation for a semiconductor device according to an embodiment of the present disclosure.

FIGS. 14 and 15 show exemplary cross sectional views of various stages for manufacturing a Fin FET device according to another embodiment of the present disclosure. Materials, configurations, dimensions, processes and/or operations same as or similar to those described with the foregoing embodiments may be employed in the following embodiments and the detailed explanation may be omitted.

During the recess etching of the fin mask layer 50 and the fin structures 20 described with respect to FIGS. 7A and 7B, some lower portions of the fin mask layer 50 disposed on sidewall of the fin structures 20 remain without being etched away thereby forming sleeve-like portions 55, as show in FIG. 14. The height H3 of the sleeve-like portions 55 is in a range from about 1 nm to about 10 nm in some embodiments.

Then, similar to FIG. 8A, the epitaxial source/drain structure 60 is formed, thereby forming voids 65', as shown in FIG. 15. Due to the sleeve-like portions 55, the height H4 of the voids 65' in this embodiment is greater than the height H2 in FIG. 8. The height H4 is in a range from about 20 nm to about 35 nm in some embodiments.

In the present disclosure, since a void is formed between the source/drain epitaxial layer and the isolation insulating layer (STI), a parasitic capacitance at the source/drain structure can be reduced. Further, by letting the fin mask layer (e.g., SiN) remain on the upper surface of the isolation insulating layer, the height (dimension) of the void can be larger.

Figure 16:
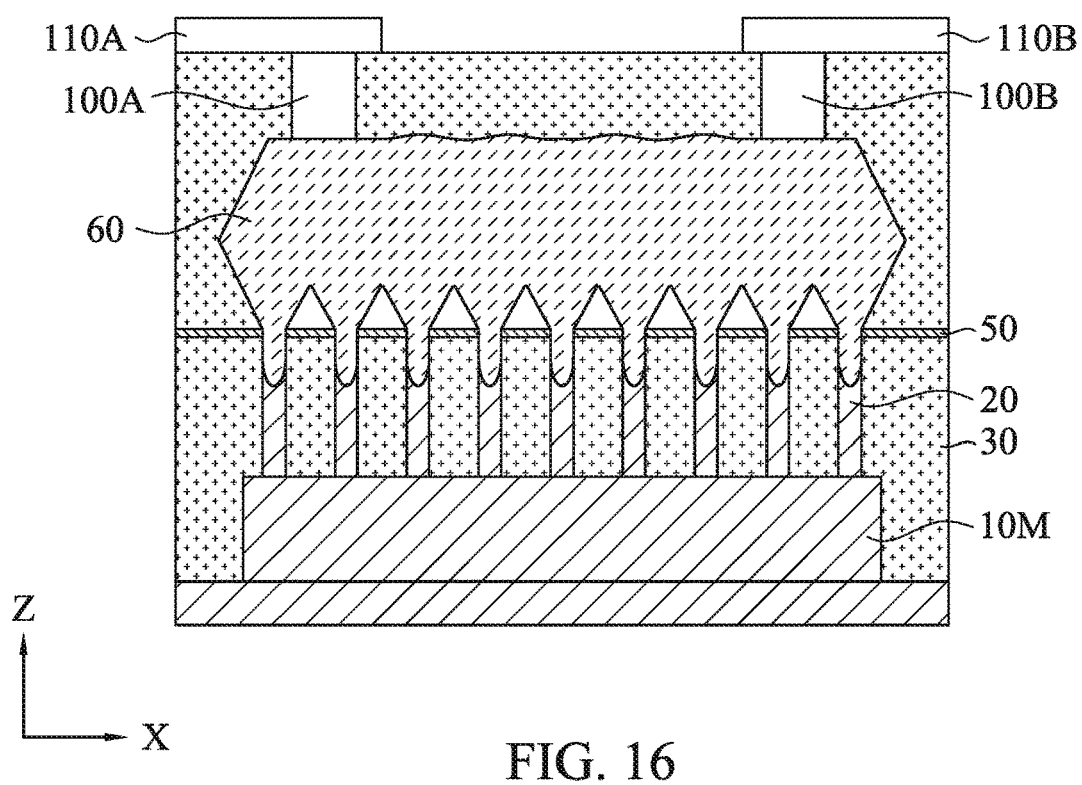
FIG. 16 shows a cross sectional view of a semiconductor device according to an embodiment of the present disclosure.

FIG. 16 shows a cross sectional view of a semiconductor device according to an embodiment of the present disclosure. Materials, configurations, dimensions, processes and/or operations same as or similar to those described with the foregoing embodiments may be employed in the following embodiments and the detailed explanation may be omitted.

As shown in FIG. 16, a plurality of fin structures 20, for example, 5 to 20 (e.g., 9) fin structures 20, are disposed over the substrate 10, and the merged source/drain epitaxial structure 60 is formed over the fin structures. In FIG. 16, an etch stop layer is omitted. As set forth above, the source/drain epitaxial layer 60 is grown from the rounded corner shape of the recessed fin structures. The rounded corner shape affects the growth of the source/drain epitaxial layer in such a manner that the epitaxial layers are more likely to merge and form the merged epitaxial structure. Further, the upper surface of the merged epitaxial layer tends to have a smoother surface than the case in which the recessed fin structure has a V-shape or a rectangular shape. In some embodiments, the upper surface of the merged epitaxial layer has an uneven surface and the peak-to-valley value of the upper surface of the merged epitaxial layer in the X direction is in a range from about 5 nm to about 20 nm, and is in a range from about 7 nm to about 15 nm in other embodiments. The peak-to-valley value is measured between a portion above the second fin structure from the left and a portion above the second fin structure from the right.

In some embodiments, as shown in FIG. 16, the merged source/drain epitaxial layer 60 is electrically coupled to a circuit element via a contact plug 100A and a metal wiring 110A and to a different circuit element via a contact plug 110A and a metal wiring 110B. In such a case, two or more gate electrodes are disposed over the plurality of fin structures in some embodiments.

In the embodiments of the present disclosure, by forming a rounded corner shaped recess in the recess etching of the source/drain regions of fin structures, it is possible to improve properties of the source/drain epitaxial layer.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device including a Fin FET, a fin structure is formed over a substrate. The fin structure extends in a first direction in plan view. An isolation insulating layer is formed over the substrate so that a lower portion of the fin structure is embedded in the isolation insulating layer and an upper portion of the fin structure is exposed from the isolation insulating layer. A gate structure is formed over a part of the fin structure. The gate structure extending in a second direction crossing the first direction in plan view. A fin mask layer is formed on sidewalls of the fin structure protruding from the isolation insulating layer and not covered by the gate structure, and on an upper surface of the isolation insulating layer. A source/drain region of the fin structure is recessed. An epitaxial source/drain structure is formed over the recessed fin structure. In the recessing the source/drain region of the fin structure, a plasma process combining etching and deposition processes is used to form a recess having a rounded corner shape in a cross section along the second direction. In one or more of the foregoing and following embodiments, the plasma process comprises applying an RF power and applying a pulsed bias. In one or more of the foregoing and following embodiments, the pulsed bias comprises a duty ratio in a range from 10% to 90%. In one or more of the foregoing and following embodiments, the pulsed bias comprises an on-voltage in a range from 300 V to 800 V. In one or more of the foregoing and following embodiments, the RF voltage comprises an input power in a range from 300 W to 800 W. In one or more of the foregoing and following embodiments, the plasma process comprises supplying HBr and He gases. In one or more of the foregoing and following embodiments, a ratio of the HBr gas and the He gas is in a range from 0.3 to 0.7. In one or more of the foregoing and following embodiments, the plasma process is performed under a pressure in a range from 1 mTorr to 100 mTorr. In one or more of the foregoing and following embodiments, the rounded corner shape is one of a U-shape and a bullet head shape in the cross section along the second direction. In one or more of the foregoing and following embodiments, the rounded corner shape is other than a semi-circular shape in the cross section along the second direction.

In accordance with another aspect of the present disclosure in a method of manufacturing a semiconductor device including a Fin FET, a plurality of fin structures are formed over a substrate. The plurality of fin structures extend in a first direction and arranged in a second direction crossing the first direction in plan view. An isolation insulating layer is formed over the substrate so that lower portions of the plurality of fin structures are embedded in the isolation insulating layer and upper portions of the plurality of fin structures are exposed from the isolation insulating layer. A fin mask layer is formed on sidewalls of source/drain regions of the plurality of fin structures protruding from the isolation insulating layer. The source/drain regions of the plurality of fin structures are recessed. An epitaxial source/drain structure is formed over each of the recessed fin structures to form a merged source/drain epitaxial layer. In the recessing the source/drain regions, a plasma process combining etching and deposition processes is used to form recesses having a rounded corner shape in a cross section along the second direction. In one or more of the foregoing and following embodiments, the depths of the recesses is in a range from 5 nm to 20 nm. In one or more of the foregoing and following embodiments, the depths are not uniform. In one or more of the foregoing and following embodiments, a difference between a maximum depth and a minimum depth is in a range from 0.5 nm to 2.5 nm. In one or more of the foregoing and following embodiments, the recess has a U-shape having a straight bottom in a cross section along the first direction. In one or more of the foregoing and following embodiments, the rounded corner shape is one of a U-shape and a bullet head shape in the cross section along the second direction. In one or more of the foregoing and following embodiments, the rounded corner shape is other than a semi-circular shape in the cross section along the second direction. In one or more of the foregoing and following embodiments, the rounded corner shape is a semi-circular shape in the cross section along the second direction. In one or more of the foregoing and following embodiments, a number of the plurality of fin structures coupled to the source/drain epitaxial layer is five to twenty.

In accordance with another aspect of the present disclosure, in a method of manufacturing a semiconductor device including a Fin FET, a first fin structure and a second fin structure are formed over a substrate. The first and second fin structures extending in a first direction in plan view. An isolation insulating layer is formed over the substrate so that lower portions of the first and second fin structures are embedded in the isolation insulating layer and upper portions of the first and second fin structures are exposed from the isolation insulating layer. A gate structure is formed over parts of the first and second fin structures, the gate structure extending in a second direction crossing the first direction in plan view. A fin mask layer is formed on sidewalls of the first and second fin structures protruding from the isolation insulating layer and not covered by the gate structure, and on an upper surface of the isolation insulating layer. The upper portions of the first and second fin structures are recessed, thereby forming a recessed first fin structure and a recessed second fin structure. A first epitaxial source/drain structure is formed over the recessed first fin structure and a second epitaxial source/drain structure is formed over the recessed second fin structure, such that the first and second epitaxial source/drain structures are merged to form a void between the merged first and second epitaxial source/drain structures and the remaining fin mask layer on the upper surface of the isolation insulating layer. In the recessing the first and second fin structure, a plasma process combining etching and deposition processes is used to form a recess having a rounded corner shape in a cross section along the second direction.

In accordance with one aspect of the present disclosure, a semiconductor device includes an isolation insulating layer disposed over a substrate, a plurality of fin structures disposed over the substrate and extending in a first direction in plan view, a gate structure disposed over parts of the plurality of fin structures, and extending in a second direction crossing the first direction, a merged source/drain epitaxial layer, and a dielectric layer disposed on an upper surface of the isolation insulating layer. The plurality of fin structures not covered by the gate structure are recessed below the upper surface of the isolation insulating layer, the merged source/drain epitaxial layer is formed over the recessed fin structures, and each of interfaces between the merged source/drain epitaxial layer and each of the recessed fin structures has a rounded corner shape in a cross section along the second direction. In one or more of the foregoing and following embodiments, depths of interfaces measured from an upper surface of the isolation insulating layer is in a range from 5 nm to 20 nm. In one or more of the foregoing and following embodiments, the depths are not uniform. In one or more of the foregoing and following embodiments, a difference between a maximum depth and a minimum depth is in a range from 0.5 nm to 2.5 nm. In one or more of the foregoing and following embodiments, the rounded corner shape is one of a U-shape and a bullet head shape in the cross section along the second direction. In one or more of the foregoing and following embodiments, the rounded corner shape is other than a semi-circular shape in the cross section along the second direction. In one or more of the foregoing and following embodiments, the interfaces have a U-shape having a straight bottom in a cross section along the first direction. In one or more of the foregoing and following embodiments, the rounded corner shape is a semi-circular shape in the cross section along the second direction. In one or more of the foregoing and following embodiments, curved portions of the rounded corner shape do not have a constant curvature. In one or more of the foregoing and following embodiments, a number of the plurality of fin structures coupled to the source/drain epitaxial layer is five to twenty. In one or more of the foregoing and following embodiments, an upper surface of the merged source/drain epitaxial layer has an uneven surface. In one or more of the foregoing and following embodiments, a peak-to-valley value of the uneven upper surface of the merged epitaxial layer in the second direction is in a range from 5 nm to 20 nm. In one or more of the foregoing and following embodiments, the semiconductor device further includes a first via plug contacting the merged source/drain epitaxial layer, and a second via plug contacting the merged source/drain epitaxial layer. The first via plug and the second via plug are electrically coupled to different circuit elements from each other. In one or more of the foregoing and following embodiments, two or more gate structure are disposed over the plurality of fin structures.

In accordance with another aspect of the present disclosure, a semiconductor device includes an isolation insulating layer disposed over a substrate, a first fin structure and a second fin structure, both disposed over the substrate and extending in a first direction in plan view, a gate structure disposed over parts of the first and second fin structures, and extending in a second direction crossing the first direction, a merged source/drain epitaxial layer, and a dielectric layer disposed on an upper surface of the isolation insulating layer. The first and second fin structures not covered by the gate structure are recessed below the upper surface of the isolation insulating layer, the merged source/drain epitaxial layer is formed over the recessed fin structures, and each of interfaces between the merged source/drain epitaxial layer and each of the recessed first and second fin structures has a rounded corner shape in a cross section along the second direction. In one or more of the foregoing and following embodiments, the interfaces have a U-shape having a straight bottom in a cross section along the first direction. In one or more of the foregoing and following embodiments, the rounded corner shape is a semi-circular shape in the cross section along the second direction. In one or more of the foregoing and following embodiments, the rounded corner shape is other than a semi-circular shape in the cross section along the second direction. In one or more of the foregoing and following embodiments, curved portions of the rounded corner shape do not have a constant curvature.

In accordance with another aspect of the present disclosure, a semiconductor device includes an isolation insulating layer disposed over a substrate, a fin structure disposed over the substrate and extending in a first direction in plan view, a gate structure disposed over a part of the structure, and extending in a second direction crossing the first direction, a source/drain epitaxial layer, and a dielectric layer disposed on an upper surface of the isolation insulating layer. The fin structure not covered by the gate structure is recessed below the upper surface of the isolation insulating layer, the source/drain epitaxial layer is formed over the recessed fin structure, and an interface between the source/drain epitaxial layer and the recessed fin structure has a rounded corner shape in a cross section along the second direction.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device including a Fin FET, the method comprising:
    forming a fin structure over a substrate, the fin structure extending in a first direction in plan view,
    forming an isolation insulating layer over the substrate so that a lower portion of the fin structure is embedded in the isolation insulating layer and an upper portion of the fin structure is exposed from the isolation insulating layer;
    forming a gate structure over a part of the fin structure, the gate structure extending in a second direction crossing the first direction in plan view;
    forming a fin mask layer on sidewalls of the fin structure protruding from the isolation insulating layer and not covered by the gate structure, and on an upper surface of the isolation insulating layer;
    recessing a source/drain region of the fin structure; and
    forming an epitaxial source/drain structure over the recessed fin structure,
    wherein in the recessing the source/drain region of the fin structure, a plasma process combining etching and deposition processes is used to form a recess having a rounded corner shape both in a cross section along the first direction and in a cross section along the second direction.

2. The method of claim 1, wherein the plasma process comprises applying an RF power and applying a pulsed bias.

3. The method of claim 2, wherein the pulsed bias comprises a duty ratio in a range from 10% to 90%.

4. The method of claim 2, wherein the pulsed bias comprises an on-voltage in a range from 300 V to 800 V.

5. The method of claim 2, wherein the RF voltage comprises an input power in a range from 300 W to 800 W.

6. The method of claim 2, wherein the plasma process comprises supplying HBr and He gases.

7. The method of claim 6, wherein a ratio of the HBr gas and the He gas is in a range from 0.3 to 0.7.

8. The method of claim 6, wherein the plasma process is performed under a pressure in a range from 1 mTorr to 100 mTorr.

9. The method of claim 1, wherein the rounded corner shape is a U-shape in the cross section along the first direction.

10. The method of claim 9, wherein the U-shape has rounded corners and a flat or a linear bottom portion.

11. A method of manufacturing a semiconductor device including a Fin FET, the method comprising:
    forming a plurality of fin structures over a substrate, the plurality of fin structures extending in a first direction and arranged in a second direction crossing the first direction in plan view,
    forming an isolation insulating layer over the substrate so that lower portions of the plurality of fin structures are embedded in the isolation insulating layer and upper portions of the plurality of fin structures are exposed from the isolation insulating layer;
    forming a fin mask layer on sidewalls of source/drain regions of the plurality of fin structures protruding from the isolation insulating layer;
    recessing the source/drain regions of the plurality of fin structures; and
    forming an epitaxial source/drain structure over each of the recessed fin structures to form a merged source/drain epitaxial layer,
    wherein in the recessing the source/drain regions, a plasma process combining etching and deposition processes is used to form recesses having a rounded corner shape both in a cross section along the first direction and in a cross section along the second direction.

12. The method of claim 11, wherein depths of the recesses is in a range from 5 nm to 20 nm.

13. The method of claim 12, wherein the depths are not uniform.

14. The method of claim 13, wherein a difference between a maximum depth and a minimum depth is in a range from 0.5 nm to 2.5 nm.

15. The method of claim 11, wherein the rounded corner shape is a U-shape having a straight bottom in the cross section along the first direction.

16. The method of claim 15, wherein the recess has rounded corner shape in a cross section along the second direction and the rounded corner shape is one of a U-shape and a bullet head shape in the cross section along the second direction.

17. The method of claim 15, wherein the recess has rounded corner shape in a cross section along the second direction and the rounded corner shape is other than a semi-circular shape in the cross section along the second direction.

18. The method of claim 15, wherein the recess has rounded corner shape in a cross section along the second direction and the rounded corner shape is a semi-circular shape in the cross section along the second direction.

19. The method of claim 11, wherein a number of the plurality of fin structures coupled to the source/drain epitaxial layer is five to twenty.

20. A method of manufacturing a semiconductor device including a Fin FET, the method comprising:
- forming a first fin structure and a second fin structure over a substrate, the first and second fin structures extending in a first direction in plan view,
- forming an isolation insulating layer over the substrate so that lower portions of the first and second fin structures are embedded in the isolation insulating layer and upper portions of the first and second fin structures are exposed from the isolation insulating layer;
- forming a gate structure over parts of the first and second fin structures, the gate structure extending in a second direction crossing the first direction in plan view;
- forming a fin mask layer on sidewalls of the first and second fin structures protruding from the isolation insulating layer and not covered by the gate structure, and on an upper surface of the isolation insulating layer;
- recessing the upper portions of the first and second fin structures, thereby forming a recessed first fin structure and a recessed second fin structure; and
- forming a first epitaxial source/drain structure over the recessed first fin structure and a second epitaxial source/drain structure over the recessed second fin structure, such that the first and second epitaxial source/drain structures are merged to form a void between the merged first and second epitaxial source/drain structures and the remaining fin mask layer on the upper surface of the isolation insulating layer,
- wherein in the recessing the first and second fin structure, a plasma process combining etching and deposition processes is used to form a recess having a rounded corner shape both in a cross section along the first direction and in a cross section along the second direction.

* * * * *